(12) United States Patent
Musio et al.

(10) Patent No.: US 12,334,879 B2
(45) Date of Patent: Jun. 17, 2025

(54) AMPLIFICATION DEVICE FOR AMPLIFYING A SIGNAL IN ELECTRO-OPTICAL TRANSCEIVERS

(71) Applicant: HUAWEI TECHNOLOGIES CO., LTD., Guangdong (CN)

(72) Inventors: Antonio Musio, Segrate (IT); Luca Piazzon, Segrate (IT)

(73) Assignee: Huawei Technologies Co., Ltd., Shenzhen (CN)

( * ) Notice: Subject to any disclaimer, the term of this patent is extended or adjusted under 35 U.S.C. 154(b) by 571 days.

(21) Appl. No.: 17/689,444

(22) Filed: Mar. 8, 2022

(65) Prior Publication Data

US 2022/0190791 A1    Jun. 16, 2022

Related U.S. Application Data

(63) Continuation of application No. PCT/EP2019/074094, filed on Sep. 10, 2019.

(51) Int. Cl.
*H03F 3/08*  (2006.01)
*H03F 3/16*  (2006.01)
*H04B 10/60* (2013.01)

(52) U.S. Cl.
CPC .............. *H03F 3/08* (2013.01); *H03F 3/16* (2013.01); *H04B 10/60* (2013.01); *H03F 2200/165* (2013.01)

(58) Field of Classification Search
CPC ........ H03F 3/08; H03F 3/16; H03F 2200/165; H04B 10/60

(Continued)

(56) References Cited

U.S. PATENT DOCUMENTS 6,734,759 B2 *  5/2004  Humann ........... H04L 25/03878
                                              333/167
7,808,258 B2 * 10/2010  Mangrum .......... G01R 31/2889
                                              324/754.18

(Continued)

FOREIGN PATENT DOCUMENTS

CN    109522608 A    3/2019
EP      0415318 A2   3/1991
EP      1132724 A2   9/2001

OTHER PUBLICATIONS

System Reference, Agilent 93000 SOC P-Series and C-Series, Agilent Technologies GmbH SOC Business Unit Agilent Part No. E7050-91017, Revision 3.0, Jan. 2001 (Year: 2001).*

(Continued)

*Primary Examiner* — Hafizur Rahman
(74) *Attorney, Agent, or Firm* — Fish & Richardson P.C.

(57) ABSTRACT

An amplification device configured for amplifying a signal with a DC signal component is provided, which comprises a coupling filter circuit having an input terminal and an output terminal. The coupling filter circuit attenuates the DC signal component of an input signal to obtain a filtered output signal. The coupling filter circuit comprises a first capacitor circuit connecting the input terminal to the output terminal; a second capacitor circuit connected in parallel to the first capacitor circuit, a first resistor and a second resistor, wherein the second capacitor, the first resistor and the second resistor are serially connected; and a resistor circuit connected to the input terminal and the output terminal and comprising a third resistor connected to the input terminal and a fourth resistor connected to the output terminal. The amplification device comprises an amplification circuit connected to the output terminal, which amplifies the filtered signal.

20 Claims, 9 Drawing Sheets

(58) Field of Classification Search
USPC .......................................................... 330/308
See application file for complete search history.

(56) References Cited

U.S. PATENT DOCUMENTS

| | | | |
|---|---|---|---|
| 8,705,767 B2* | 4/2014 | Hiensch | H04R 19/02 |
| | | | 330/10 |
| 2006/0009182 A1 | 1/2006 | Yoneda et al. | |
| 2006/0182449 A1 | 8/2006 | Iannelli et al. | |
| 2020/0266782 A1* | 8/2020 | Daniels | H03F 3/68 |

OTHER PUBLICATIONS

PCT International Search Report and Written Opinion issued in International Application No. PCT/EP2019/074094 on Jun. 5, 2020, 12 pages.

\* cited by examiner

AMPLIFICATION DEVICE FOR AMPLIFYING A SIGNAL IN ELECTRO-OPTICAL TRANSCEIVERS

CROSS-REFERENCE TO RELATED APPLICATIONS

This application is a continuation of International Application No. PCT/EP2019/074094, filed on Sep. 10, 2019, the disclosure of which is hereby incorporated by reference in its entirety.

TECHNICAL FIELD

In general, the present invention relates to the field of optical communication. More specifically, the present invention relates to an amplification device within a transceiver for amplifying a signal for optical communication.

BACKGROUND

In a transmitter for optical communications, a broadband driver amplifier is used to increase the level of a high-speed digital source in order to supply enough power to properly drive the electro-optical modulator. In this regard, AC-coupling connection between the high-speed digital source and the driver amplifier is required for decoupling a DC voltage coming from the high-speed digital source.

Driver amplifiers with integrated AC-coupling are of high interest because they drastically reduce module size, number of components and costs. Recently, the updated IEEE 802.3bs standard requires low cut-off frequency below 300 KHz, instead of 1 MHz as in old standard. It is thus advantageous to obtain driver amplifiers with integrated input AC-coupling and extended low cut-off frequency, as they allow optical modules to be compliant with new standard.

Figure 1:
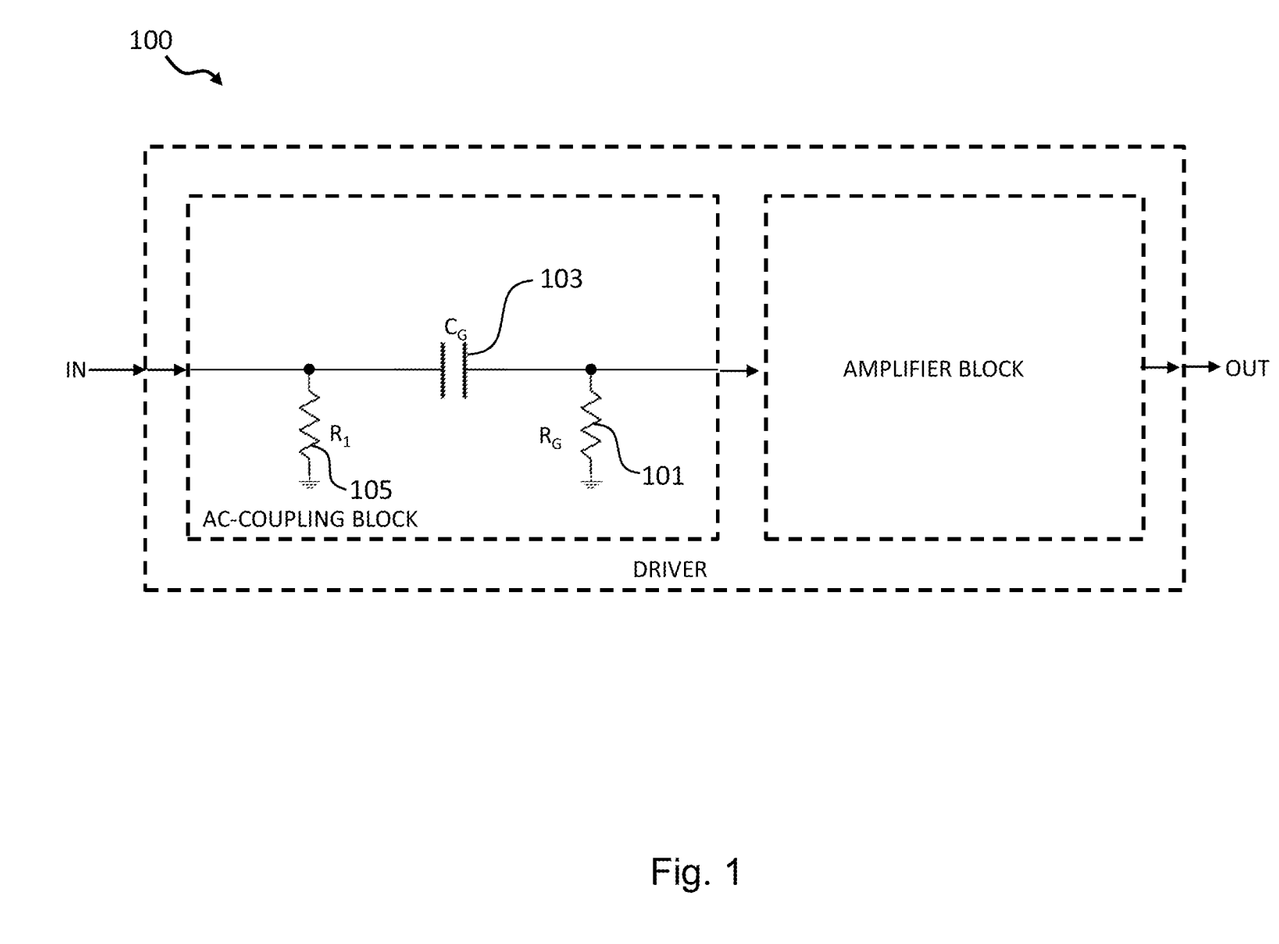
FIG. 1 shows a schematic diagram of a state-of-the-art integrated AC-coupled driver amplifier scheme.

A typical scheme of a driver amplifier 100 adopted in the prior art to achieve AC-coupling is shown in FIG. 1. The scheme includes an RC filter composed of 3 elements: a resistor $R_G$ 101 used to provide the proper bias voltage to the driver input; a capacitor $C_G$ 103 used to decouple the DC voltage coming from the high-speed digital source; and a resistor $R_1$ 105 used to provide the proper matched impedance for the high-speed digital source.

The low cut-off frequency $\omega_{LCF}$ of the driver amplifier 100 in FIG. 1 can be estimated by using the following equation:

$$\omega_{LCF} = \frac{1}{R_G \cdot C_G}$$

where $R_G$ and $C_G$ denote resistance of the resistor 101 and capacitance of the capacitor 103 respectively.

In view of the above equation, the low cut-off frequency can be extended, i.e. reduced, by either increasing the capacitance or the resistance. Extending the low cut-off frequency by increasing the capacitance of the capacitor $C_G$ also reduces the high cut-off frequency $\omega_{HCF}$ of the driver amplifier, thus reducing the maximum data-rate supported by the driver amplifier itself. This undesired effect is due to the parasitic capacitance that real integrated metal-insulator-metal (MIM) capacitors have.

Figure 2:
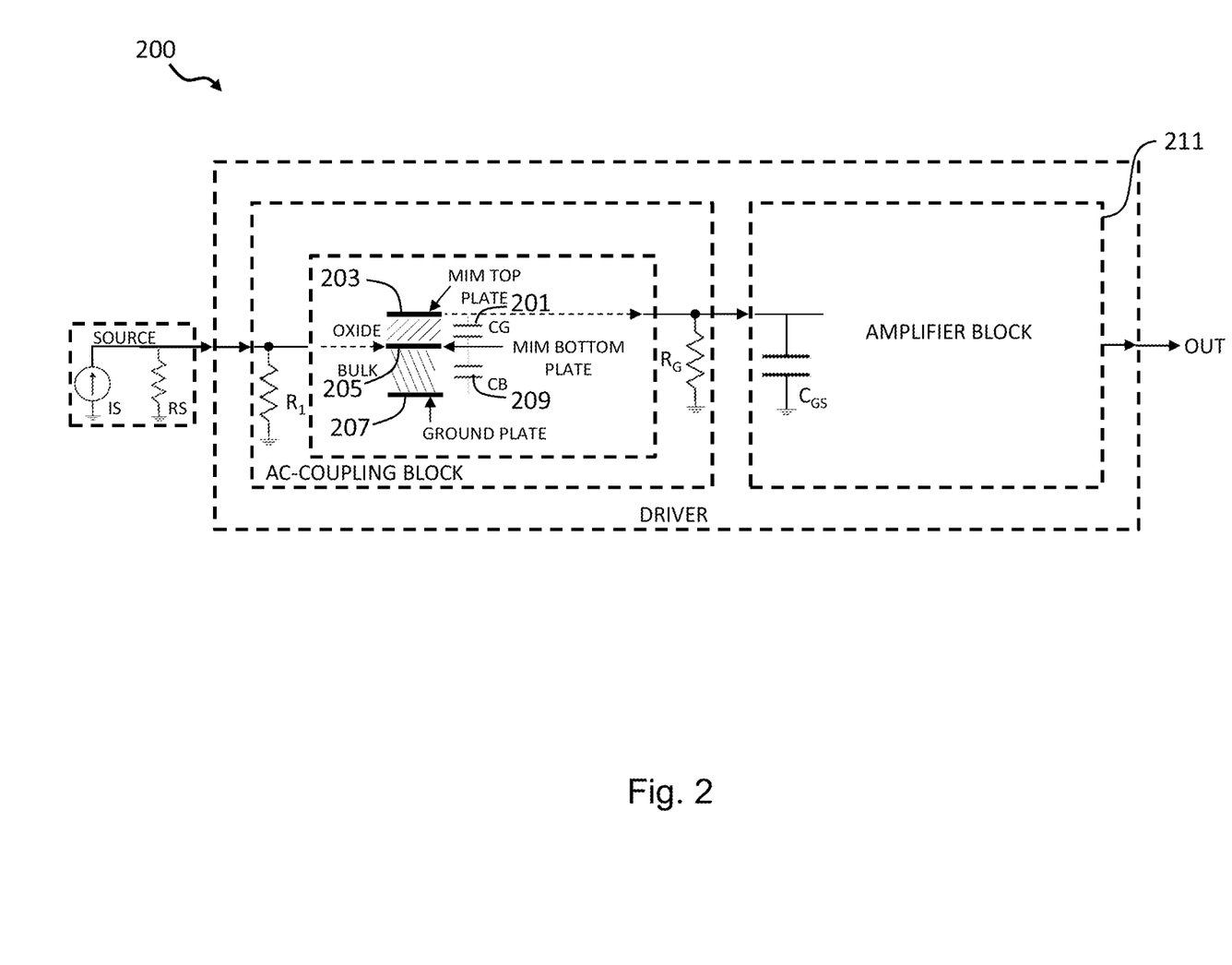
FIG. 2 shows a schematic diagram of a state-of-the-art integrated AC-coupled driver amplifier scheme based on a metal-insulator-metal capacitor.

FIG. 2 shows a similar scheme of a driver amplifier 200 as in FIG. 1, where the capacitor 201 CG is realized by means of an integrated MIM capacitor. The MIM capacitor is composed of two metal plates, a top plate 203 and a bottom plate 205, and an insulator material (oxide) lies between the two metal plates.

The capacitance between the bottom plate 205 and top plate 203 realize the capacitor CG 201. However, an integrated driver amplifier has also a ground metal plate 207 that generates an undesired capacitance effect to ground with the bottom plate 205 of the MIM capacitor. This undesired capacitance effect can be represented by a capacitor CB 209 and it is proportional to the MIM capacitor area.

The parasitic capacitor CB 209 affects the high cut-off frequency $\omega_{HCF}$ of the driver amplifier as shown in the following equation:

$$\omega_{HCF} = \frac{R_S + R_1}{R_S \cdot R_1 \cdot (C_{GS} + C_B)}$$

wherein $R_1$ denotes resistance of the resistor R1, $C_B$ denotes capacitance of the capacitor CB, $R_S$ denotes the output impedance of the high-speed digital source, and $C_{GS}$ denotes the input capacitance of the amplifier block 211.

In order to extend the low cut-off frequency, the area of the MIM capacitor has to be increased, thus increasing the value of the capacitor CG. However, the MIM capacitor area increment also increases the value of the capacitor CB, thus resulting in reduced high cut-off frequency $\omega_{HCF}$.

Another possible solution in a prior-art scheme is to increase the value of the resistor $R_G$. However, this leads to a reliability issue for the driver amplifier. In fact, real transistors composing the amplifier block of the driver amplifier suffer from leakage current from output to input. This leakage current, flowing across the resistor, generates a DC voltage at the input of the amplifier block that increases the output current of the amplifier block itself As a consequence, the channel temperature of the transistors composing the amplifier block increases, resulting in reliability and life time risks. As a conclusion, any increase of the resistor, in order to extend the low cut-off frequency, reduces the reliability margin and life-time of the driver amplifier.

Moreover, the previous works do not allow to extend the low cut-off frequency of a driver amplifier without reducing the maximum data-rate or life-time of the driver amplifier itself.

In light of the above, there is still a need for an improved amplifier device for amplifying a signal with a DC signal component more efficiently.

SUMMARY

It is an object of the invention to provide an amplifier device, which solves the drawbacks of the prior art. For example, it is an object to provide an amplifier device for amplifying a signal and filtering out a DC component of the signal.

The foregoing and other objects are achieved by the subject matter of the independent claims. Further implementation forms are apparent from the dependent claims, the description and the figures.

Generally, the present invention relates to an integrated driver amplifier device for amplifying a signal and filtering out a DC component of the signal. Embodiments of the invention allow to extend low cut-off frequency of the driver amplifier that integrates AC-coupled components without reducing high cut-off frequency or reliability margin of the driver amplifier itself More specifically, according to a first aspect the invention relates to an amplification device which is configured for amplifying a signal, wherein the signal has a DC signal component. The amplification device comprises: a coupling filter circuit having an input terminal for receiving the input signal and an output terminal for outputting a filtered output signal, wherein the coupling filter circuit is configured to at least attenuate the DC signal component of the input signal to obtain the filtered output signal. The coupling filter circuit comprises: a first capacitor circuit connecting the input terminal to the output terminal, the first capacitor circuit comprising a first capacitor; and a second capacitor circuit connected in parallel to the first capacitor circuit, the second capacitor circuit comprising a second capacitor, a first resistor and a second resistor, wherein the second capacitor, the first resistor and the second resistor are serially connected. The coupling filter circuit further comprises: a resistor circuit connected to the input terminal and the output terminal, the resistor circuit comprising a third resistor connected to the input terminal and a fourth resistor connected to the output terminal. The amplification device further comprises an amplification circuit connected to the output terminal, wherein the amplification circuit is configured to amplify the filtered signal to obtain an amplified filtered signal.

Thus, an improved amplification device is provided, allowing amplifying a signal and filtering out a DC component of the signal.

In a further possible implementation form of the first aspect, the second capacitor circuit is connected in parallel to the first capacitor of the first capacitor circuit.

In a further possible implementation form of the first aspect, the first capacitor circuit is composed only of the first capacitor.

In a further possible implementation form of the first aspect, the second capacitor is connected between the first resistor and the second resistor, wherein the first resistor is directly connected to the input terminal and the second resistor is directly connected to output terminal.

Thus, the low cut-off frequency of the amplification device is reduced without affecting the high cut-off frequency.

In a further possible implementation form of the first aspect, the second capacitor circuit is composed only of the second capacitor, the first resistor and the second resistor.

Thus, the low cut-off frequency of the amplification device is reduced without affecting the high cut-off frequency.

In a further possible implementation form of the first aspect, the third resistor of the resistor circuit is arranged to couple the input terminal to a reference potential, in particular to a ground potential, and/or the fourth resistor of the resistor circuit is arranged to couple the output terminal to a reference potential, in particular to a ground potential.

Thus, the input terminal and/or the output terminal can be connected to a reference potential respectively.

In a further possible implementation form of the first aspect, the amplification circuit comprises or is formed by a field effect transistor having a gate terminal, wherein the output terminal is connected to the gate terminal.

Thus, the filtered digital signal output from the output terminal can be amplified.

In a further possible implementation form of the first aspect, the amplification device further comprises a further coupling filter circuit, the further coupling circuit being formed identical to the coupling circuit, the coupling circuit and the further coupling circuit being arranged for differential mode operation.

Thus, the coupling filter can be used in applications based on differential signal.

In a further possible implementation form of the first aspect, the amplification device further comprises a further amplification circuit, in particular a further field effect transistor, arranged downstream the further coupling filter circuit.

Thus, the filtered digital signal provided by the further coupling filter circuit can be further amplified.

In a further possible implementation form of the first aspect, the further coupling filter circuit comprises a further input terminal for receiving an inverted version of the input signal, a further output terminal for outputting a further filtered output signal.

The further coupling filter circuit comprises: a further first capacitor circuit connecting the further input terminal to the further output terminal, the further first capacitor circuit comprising a further first capacitor; a further second capacitor circuit connected in parallel to the further first capacitor circuit, the further second capacitor circuit comprising a further second capacitor, a further first resistor and a further second resistor, the further second capacitor, the further first resistor and the further second resistor being serially connected; and a further resistor circuit connected to the further input terminal and the further output terminal, the further resistor circuit comprising a further third resistor connected to the further input terminal and a further fourth resistor connected to the further output terminal.

The third resistor of the resistor circuit and the further third resistor of the further resistor circuit are electrically connected, thereby connecting the coupling filter circuit to the further coupling filter circuit.

In a further possible implementation form of the first aspect, the third resistor and the further third resistor are electrically connected at a connection point, wherein the amplification device comprises a shunting capacitor connecting the connection point to a reference potential, in particular to a ground potential.

Thus, the shunting capacitor of the amplification device can shunt a high frequency common-mode.

In a further possible implementation form of the first aspect, the amplification device further comprises a diode circuit comprising a first diode and a second diode, the first diode and the second diode being connected antiparallel to each other, the antiparallel diode circuit connecting the connection point to reference potential, in particular a ground potential.

Thus, the shunting capacitor can be protected from electro-static discharge.

In a further possible implementation form of the first aspect, the respective input terminal is connected via a shunt resistor to a reference potential, in particular to a ground potential.

In a further possible implementation form of the first aspect, the respective coupling filter circuit has an electrical bandpass characteristic, in particular with a lower cut-off frequency being equal to 300 kHz within a tolerance range, in particular +/−5% or +/−10%.

Thus, the respective coupling filter circuit is compliant with the IEEE 802.3bs standard.

In a further possible implementation form of the first aspect, the respective coupling filter circuit comprises integrated capacitors according to the metal-insulator-metal technology.

According to a second aspect the invention relates to an optical receiver comprising the amplification device of the first aspect, wherein the optical receiver comprises a converter configured to convert an optical signal into an electrical signal.

Thus, an improved optical receiver is provided, allowing converting an optical signal into an electrical signal more efficiently.

BRIEF DESCRIPTION OF THE DRAWINGS

Further embodiments of the invention will be described with respect to the following figures, wherein.

In the various figures, identical reference signs will be used for identical or at least functionally equivalent features.

DETAILED DESCRIPTION OF EMBODIMENTS

In the following description, reference is made to the accompanying drawings, which form part of the disclosure, and in which are shown, by way of illustration, specific aspects in which the present invention may be placed. It will be appreciated that other aspects may be utilized and structural or logical changes may be made without departing from the scope of the present invention. The following detailed description, therefore, is not to be taken in a limiting sense, as the scope of the present invention is defined by the appended claims.

For instance, it will be appreciated that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures.

Moreover, in the following detailed description as well as in the claims embodiments with different functional blocks or processing units are described, which are connected with each other or exchange signals. It will be appreciated that the present invention covers embodiments as well, which include additional functional blocks or processing units that are arranged between the functional blocks or processing units of the embodiments described below.

Finally, it is understood that the features of the various exemplary aspects described herein may be combined with each other, unless specifically noted otherwise.

As will be described in more detail in the following under reference to FIGS. 3 and 4, embodiments of the invention relate to an amplification device 300 which is configured for amplifying a signal that has a DC component to be filtered.

Figure 3:
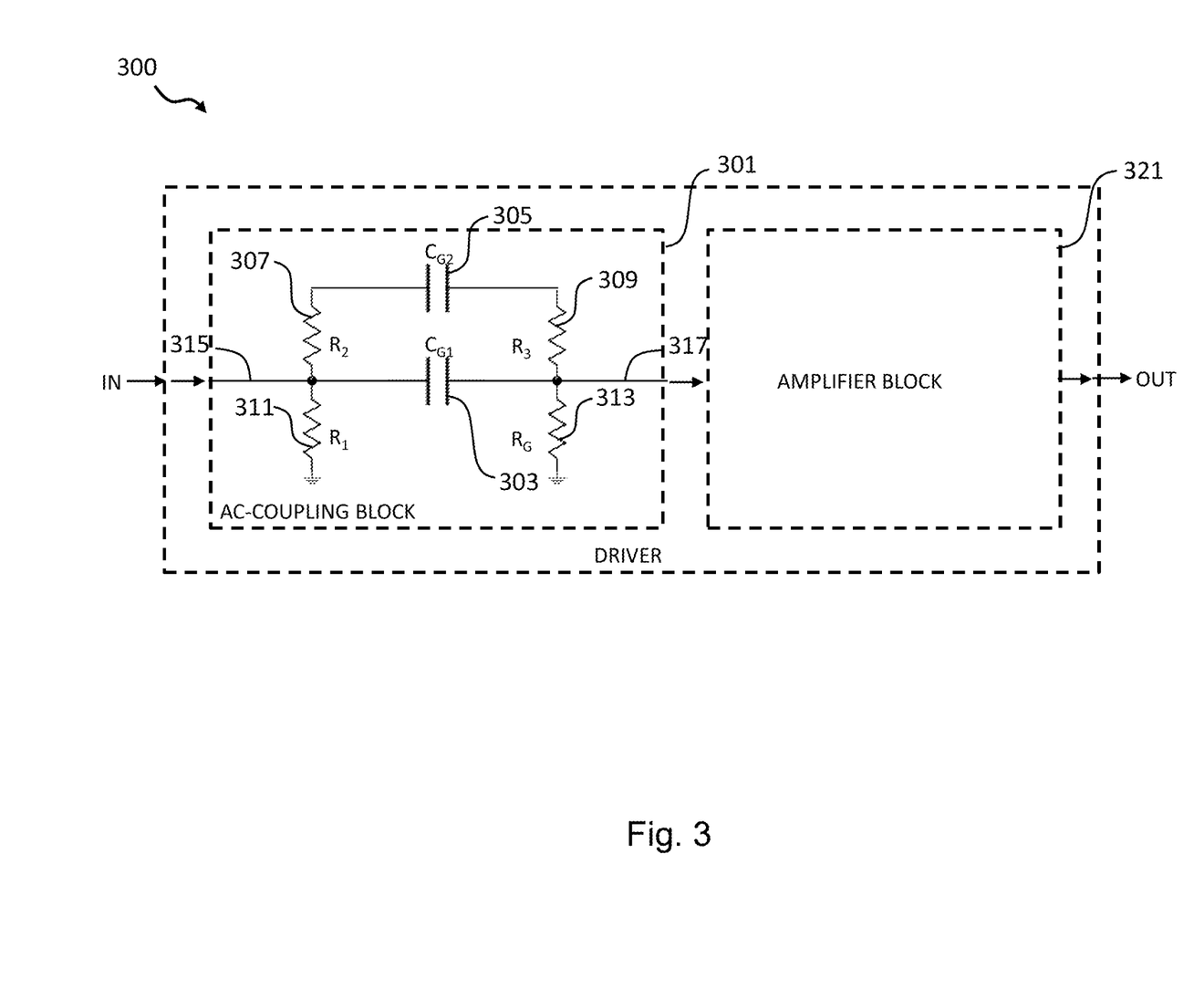
FIG. 3 shows a schematic diagram of an amplification device according to an embodiment.

As can be seen from FIG. 3, the amplification device 300 comprises: a coupling filter circuit 301 having an input terminal 315 for receiving the input signal and an output terminal 317 for outputting a filtered output signal, wherein the coupling filter circuit 301 is configured to at least attenuate the DC signal component of the input signal to obtain the filtered output signal.

According to an embodiment, the coupling filter circuit 301 comprises: a first capacitor circuit connecting the input terminal 315 to the output terminal 317, the first capacitor circuit comprising a first capacitor 303; and a second capacitor circuit connected in parallel to the first capacitor circuit, the second capacitor circuit comprising a second capacitor 305, a first resistor 307 and a second resistor 309, wherein the second capacitor 305, the first resistor 307 and the second resistor 309 are serially connected.

According to an embodiment, the coupling filter circuit 301 further comprises: a resistor circuit connected to the input terminal 315 and the output terminal 317, the resistor circuit comprising a third resistor 311 connected to the input terminal 315 and a fourth resistor 313 connected to the output terminal 317.

The amplification device 300 further comprises an amplification circuit 321 connected to the output terminal 317, wherein the amplification circuit 321 is configured to amplify the filtered signal to obtain an amplified filtered signal.

Figure 4:
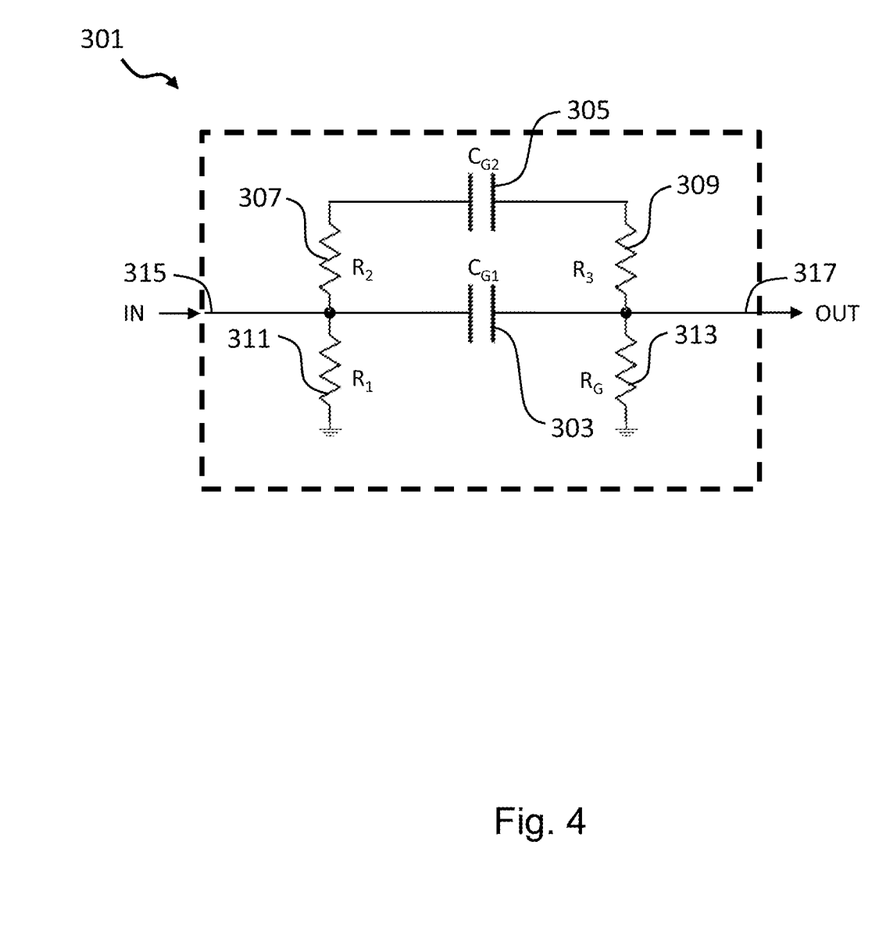
FIG. 4 shows a schematic diagram of an integrated AC-coupled driver amplifier according to an embodiment.

FIG. 4 shows a more general schematic diagram of an integrated coupling filter circuit 301 according to an embodiment, wherein the coupling filter circuit 301 comprises mainly the following components: two capacitors ($C_{G1}$ 303 and $C_{G2}$ 305); four resistors ($R_1$ 311, $R_2$ 309, $R_3$ 307 and $R_G$ 313); an input port 315 (IN) and an output port 317 (OUT).

As shown in FIGS. 3 and 4, the second capacitor circuit is connected in parallel to the first capacitor 303 of the first capacitor circuit and the first capacitor circuit is composed only of the first capacitor 303. Likewise, the second capacitor circuit is composed only of the second capacitor 305, the first resistor 307 and the second resistor 309. The second capacitor 305 is connected between the first resistor 307 and the second resistor 309, and the first resistor 307 is directly connected to the input terminal 315 and the second resistor 309 is directly connected to output terminal 317.

According to an embodiment, the third resistor 311 of the resistor circuit is arranged to couple the input terminal 315 to a reference potential, in particular to a ground potential, and/or the fourth resistor 313 of the resistor circuit is arranged to couple the output terminal 317 to a reference potential, in particular to a ground potential. Further, the amplification circuit comprises or is formed by a field effect transistor having a gate terminal, wherein the output terminal is connected to the gate terminal.

According to embodiments of the invention, the low cut-off frequency of the driver amplifier can be extended without reducing the maximum data-rate or life-time of the driver amplifier itself, through a proper choice of the values of the second capacitor $C_{G2}$ 305 and the first resistor $R_3$ 307 as well as the second resistor R$_2$ 309. To highlight the benefits, it is convenient to analyze the driver amplifier according to an embodiment in a low frequency range and in a high frequency range, which will be demonstrated in the following under reference to FIGS. 5 and 6.

Figure 5:
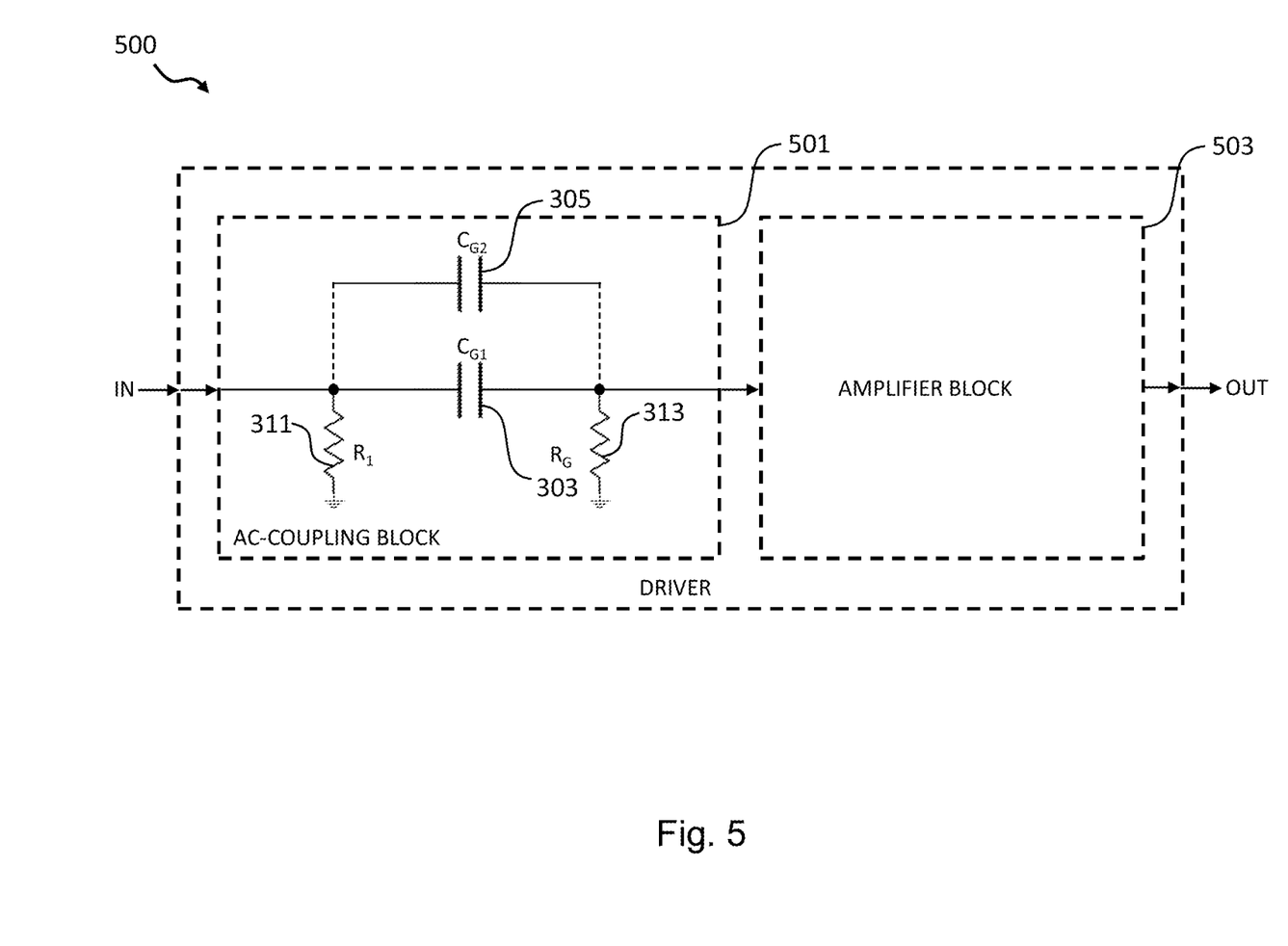
FIG. 5 shows a schematic diagram of an amplification device according to an embodiment.

In the low frequency range, the equivalent impedance of the second capacitor C$_{G2}$ 305 is much higher than the first resistor R$_3$ 307 and the second resistor R$_2$ 309. As a consequence, the proposed amplification device shown in FIG. 3 can be simplified into the amplification device 500 shown in FIG. 5, wherein the amplification device 500 comprises a coupling filter circuit 501 and an amplification circuit 503. The resulting low cut-off frequency ($\omega_{LCF}$) of the amplification device 500 in FIG. 5 can be estimated by using the following equation:

$$\omega_{LCF} = \frac{1}{R_G \cdot (C_{G1} + C_{G2})}.$$

Thus, assuming that the first capacitor C$_{G1}$ 303 is equal to the capacitor C$_G$ as in FIG. 1, the low cut-off frequency ($\omega_{LCF}$) of the proposed amplifier is reduced, i.e. extended, without affecting reliability margin of the driver amplifier by increasing the value of the resistor R$_G$.

Figure 6:
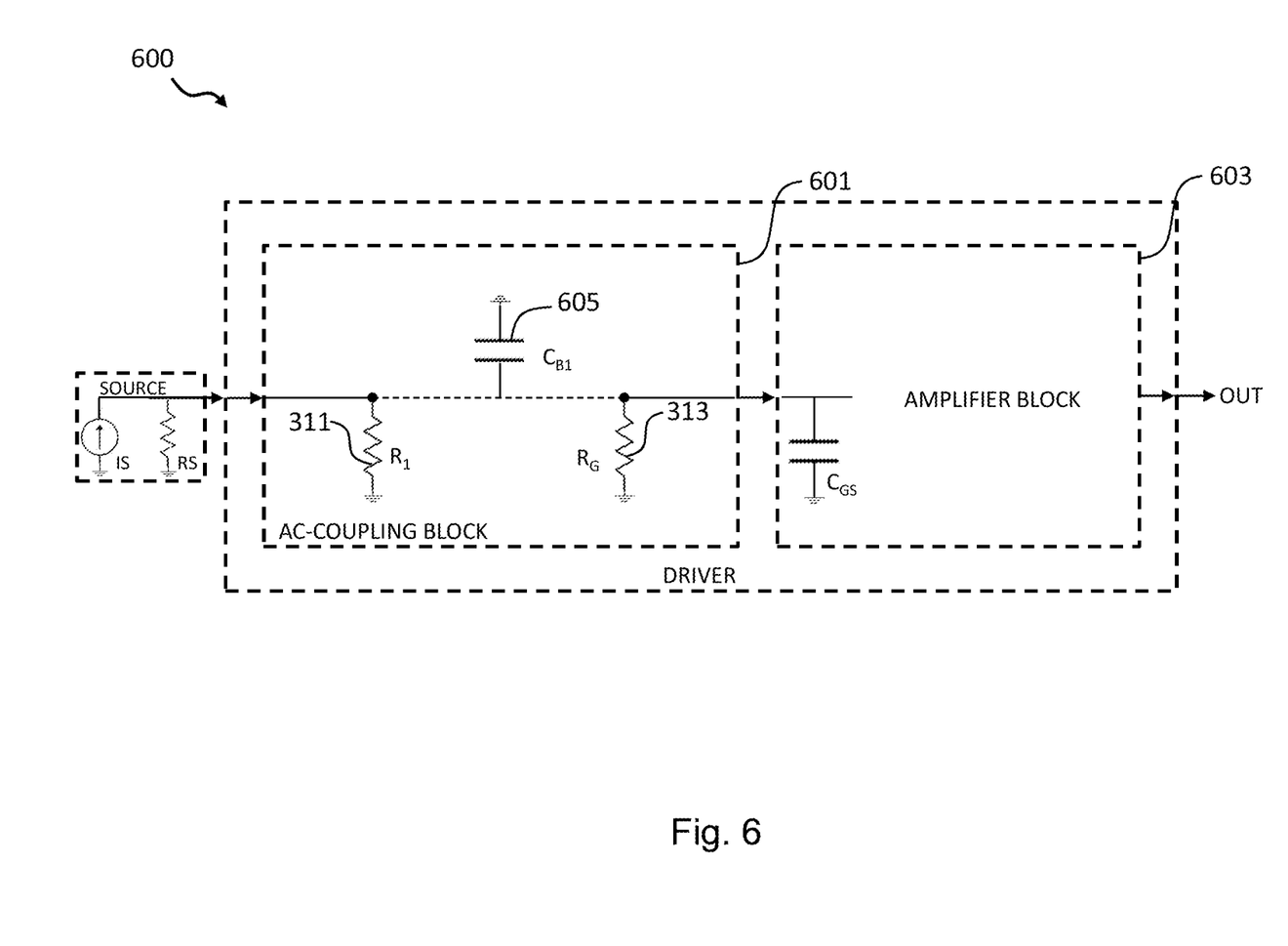
FIG. 6 shows a schematic diagram of an amplification device according to an embodiment.

In the high frequency range, the equivalent impedance of the first capacitor C$_{G1}$ 303 and the second capacitor C$_{G2}$ 305 is much higher than the first resistor R$_3$ 307 and the second resistor R$_2$ 309 according to an embodiment. As a consequence, the embodiment shown in FIG. 3 can be simplified into the amplification device 600 shown in FIG. 6, wherein the amplification device 600 comprises a coupling filter circuit 601 and an amplification circuit 603. The resulting high cut-off frequency ($\omega_{HCF}$) of the amplification device 600 in FIG. 6 can be estimated by using the following equation:

$$\omega_{HCF} = \frac{R_S + R_1}{R_S \cdot R_1 \cdot (C_{GS} + C_{B1})}$$

wherein C$_{B1}$ denotes the parasitic capacitor 605 to ground of the first capacitor C$_{G1}$ 303. From the above equation, it is to be noted that the parasitic capacitor to ground (C$_{B2}$) of the second capacitor C$_{G2}$ 305 does not affect the high cut-off frequency of the amplification device 600.

To further demonstrate the benefits of the amplification device according to embodiments of the invention, a numerical example will be discussed in the following.

It is assumed that a driver amplifier is designed to achieve a low cut-off frequency of 1 MHz and a high cut-off frequency of 45 GHz. The resulting values of capacitors and resistors in a prior art driver amplifier are as follows: R$_S$, R$_1$, and R$_G$ are 50 Ohm, 50 Ohm and 50 KOhm respectively; C$_G$, C$_B$ and C$_{GS}$ are 3.2 pF, 32 fF and 110 fF respectively, wherein it is assumed that the parasitic capacitor to ground of the MIM capacitor (C$_B$) is hundred times lower than the MIM capacitor value (C$_G$). Moreover, an input capacitance of 110 fF is assumed for the amplifier block. Finally, the output impedance of the source (R$_S$) is assumed to be 50 Ohm.

By using the aforementioned equations in the background section, it is possible to derive 1 MHz as low cut-off frequency and 45 GHz as high cut-off frequency. It is now required to extend the low cut-off frequency of the driver amplifier to 300 KHz in order be compliant with new standard, without affecting reliability margin of the driver amplifier.

By using the prior art scheme, the only solution is to increase the MIM capacitor value (i.e. CG=10.6 pF), wherein R$_S$, R$_1$, and R$_G$ are 50 Ohm, 50 Ohm and 50 KOhm respectively; C$_G$, C$_B$ and C$_{GS}$ are 10.6 pF, 106 fF and 110 fF respectively.

However, the parasitic capacitor to ground (C$_B$) also increases, resulting in a reduced high frequency cut-off which is equal to 29.5 GHz.

On the contrary, the low cut-off frequency can be extended without affecting the high cut-off frequency for the embodiments of the invention. In fact, it is possible to select proper values for the second capacitor C$_{G2}$ and the first resistor R$_3$ 307 as well as the second resistor R$_2$ 309 as follows: R$_S$, R$_1$, and R$_G$ are 50 Ohm, 50 Ohm and 50 KOhm respectively; C$_G$, C$_B$ and C$_{GS}$ are 3.2 pF, 32 fF and 110 fF respectively; R$_2$, R$_3$, C$_{G2}$, and C$_{B2}$ are 3 KOhm, 3 KOhm, 7.4 pF and 74 fF respectively.

By using the above equations as discussed along with FIGS. 5 and 6, it is possible to find that the low cut-off frequency of the amplification device is extended to 300 KHz, while the high cut-off frequency is kept as the original case, i.e. equal to 45 GHz.

Figure 7:
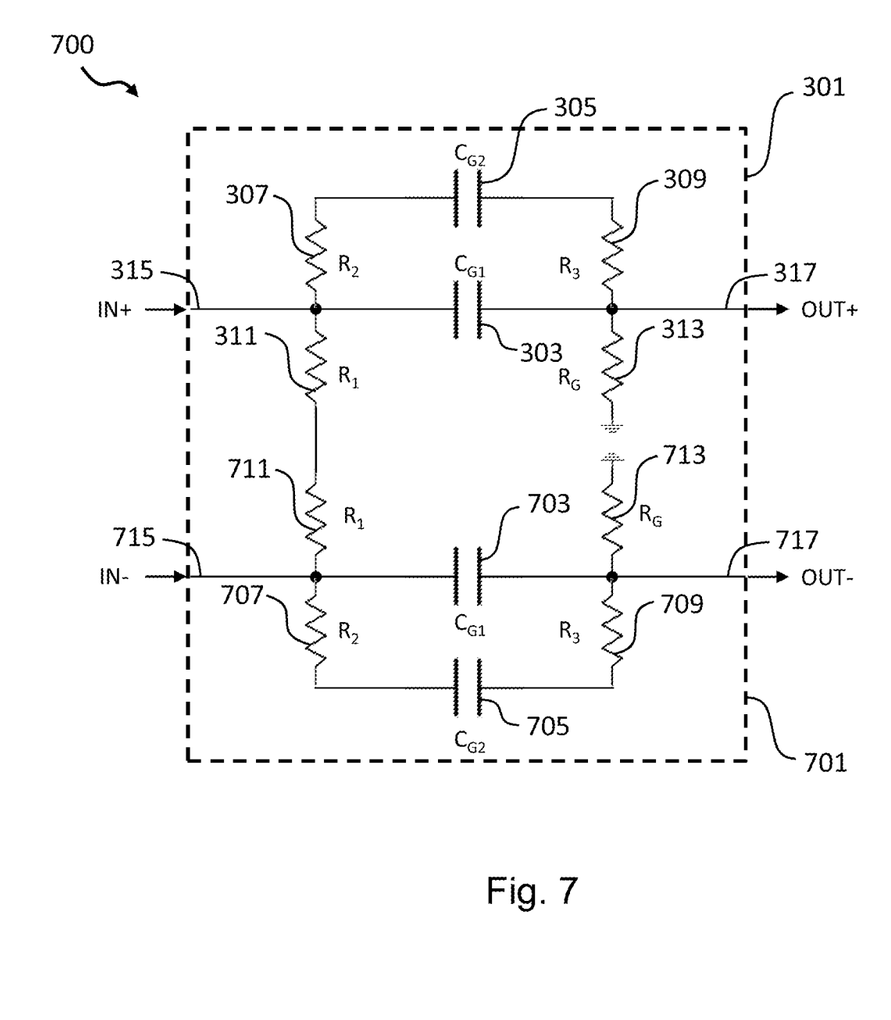
FIG. 7 shows a schematic diagram of an integrated AC-coupled driver amplifier according to an embodiment in differential mode.

According to a further embodiment, FIG. 7 shows a schematic diagram of an exemplary amplification device 700, which can be used in differential-mode. As can be taken in a close view from FIG. 7, the amplification device 700 further comprises a coupling filter circuit 301 and a further coupling filter circuit 701, wherein the further coupling circuit 701 is formed identical to the coupling filter circuit 301, and the coupling filter circuit 301 and the further coupling filter circuit 701 are arranged for differential mode operation.

In an embodiment, the amplification device 700 further comprises a further amplification circuit, in particular a further field effect transistor, arranged downstream the further coupling filter circuit 701.

As in FIGS. 3 and 4, the coupling filter circuit 301 comprises: a first capacitor circuit connecting the input terminal 315 to the output terminal 317, the first capacitor circuit comprising a first capacitor 303; and a second capacitor circuit connected in parallel to the first capacitor circuit, the second capacitor circuit comprising a second capacitor 305, a first resistor 307 and a second resistor 309, wherein the second capacitor 305, the first resistor 307 and the second resistor 309 are serially connected. According to an embodiment, the coupling filter circuit 301 further comprises: a resistor circuit connected to the input terminal 315 and the output terminal 317, the resistor circuit comprising a third resistor 311 connected to the input terminal 315 and a fourth resistor 313 connected to the output terminal 317.

In a further embodiment, the further coupling filter circuit 701 comprises a further input terminal 715 for receiving an inverted version of the input signal, a further output terminal 717 for outputting a further filtered output signal.

The further coupling filter circuit 701 comprises: a further first capacitor circuit connecting the further input terminal 715 to the further output terminal 717, the further first capacitor circuit comprising a further first capacitor 703; a further second capacitor circuit connected in parallel to the further first capacitor circuit, wherein the further second capacitor circuit comprises a further second capacitor 705, a further first resistor 707 and a further second resistor 709.

The further second capacitor 705, the further first resistor 707 and the further second resistor 709 are serially connected.

In an embodiment, the further coupling filter circuit 701 also comprises: a further resistor circuit connected to the further input terminal 715 and the further output terminal 717, the further resistor circuit comprising a further third resistor 711 connected to the further input terminal 715 and a further fourth resistor 713 connected to the further output terminal 717.

As seen in FIG. 7, the third resistor 311 of the resistor circuit and the further third resistor 711 of the further resistor circuit are electrically connected, thereby connecting the coupling filter circuit 301 to the further coupling filter circuit 701.

Figure 8:
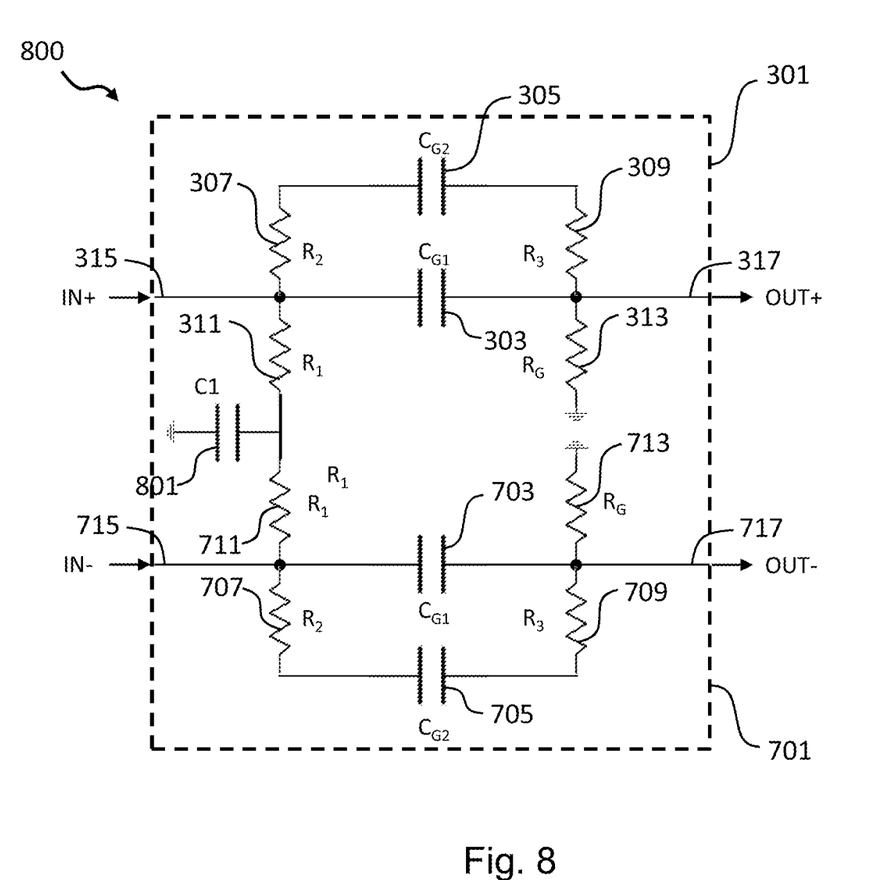
FIG. 8 shows a schematic diagram of an integrated AC-coupled driver amplifier comprising a shunting capacitor according to an embodiment in differential mode.

FIG. 8 shows a schematic diagram of an exemplary amplification device 800 according to an embodiment, where a capacitor (C1) is added into the amplification device 700 as shown in FIG. 7 in order to shunt a high frequency common-mode. Similar to the amplification device 700 in FIG. 7, the amplification device 800 comprises a coupling filter circuit 301 and a further coupling filter circuit 701, wherein the further coupling circuit 701 is formed identical to the coupling filter circuit 301.

In particular, the third resistor 311 and the further third resistor 711 are electrically connected at a connection point, wherein the amplification device 800 comprises a shunting capacitor 801 connecting the connection point to a reference potential, in particular to a ground potential.

Figure 9:
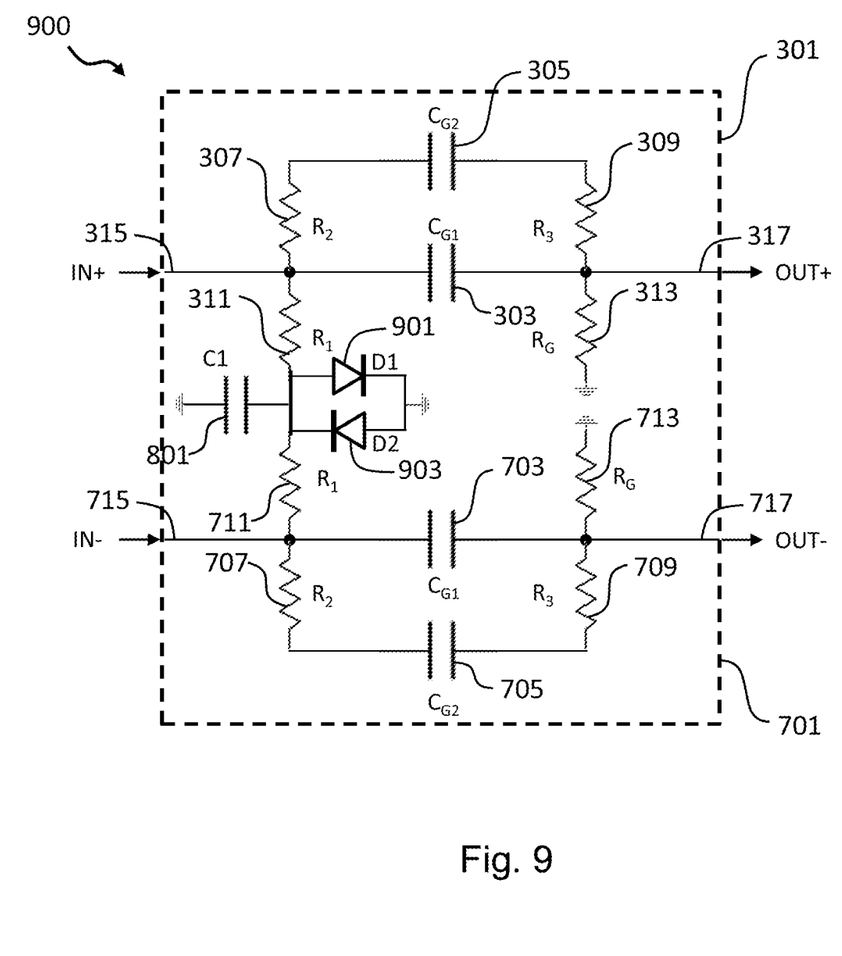
FIG. 9 shows a schematic diagram of an integrated AC-coupled driver amplifier comprising a diode circuit according to an embodiment in differential mode.

FIG. 9 shows a schematic diagram of an exemplary amplification device 900 according to an embodiment, where two diodes, a first diode 901 and a second diode 903, are added into the amplification device 800 as shown in FIG. 8 in order to protect the shunting capacitor 801 from electro-static discharge.

Similar to the amplification device 700 in FIG. 7 or the amplification device 800 in FIG. 8, the amplification device 900 also comprises a coupling filter circuit 301 and a further coupling filter circuit 701, wherein the further coupling circuit 701 is formed identical to the coupling filter circuit 301.

In an embodiment, the amplification device 900 comprises a diode circuit comprising a first diode 901 and a second diode 903, wherein the first diode 901 and the second diode 903 are connected antiparallel to each other, the antiparallel diode circuit connecting the connection point to reference potential, in particular a ground potential.

In an embodiment, the respective input terminal is connected via a shunt resistor to a reference potential, in particular to a ground potential.

In an embodiment, the respective coupling filter circuit has an electrical bandpass characteristic, in particular with a lower cut-off frequency being equal to 300 kHz within a tolerance range, in particular +/−5% or +/−10%.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

The invention claimed is:

1. An amplification device configured for amplifying a signal, the amplification device comprising:
    a coupling filter circuit having an input terminal for receiving an input signal and an output terminal for outputting a filtered output signal, wherein the coupling filter circuit is configured to at least attenuate a DC signal component of the input signal to obtain the filtered output signal, wherein the coupling filter circuit comprises
        a first capacitor circuit connecting the input terminal to the output terminal, the first capacitor circuit comprising a first capacitor;
        a second capacitor circuit connected in parallel to the first capacitor circuit, the second capacitor circuit comprising a second capacitor, a first resistor and a second resistor, the second capacitor, the first resistor and the second resistor being serially connected; and
        a resistor circuit connected to the input terminal and the output terminal, the resistor circuit comprising a third resistor connected to the input terminal and a fourth resistor connected to the output terminal;
    an amplification circuit connected to the output terminal, the amplification circuit being configured to amplify the filtered output signal to obtain an amplified filtered signal; and
    a further coupling filter circuit, wherein the further coupling filter circuit comprises a further input terminal for receiving an inverted version of the input signal and a further output terminal for outputting a further filtered output signal, and wherein the coupling filter circuit has an electrical bandpass characteristic.

2. The amplification device according to claim 1, wherein the second capacitor circuit is connected in parallel to the first capacitor of the first capacitor circuit.

3. The amplification device according to claim 1, wherein the first capacitor circuit is composed only of the first capacitor.

4. The amplification device according to claim 1, wherein the second capacitor is connected between the first resistor and the second resistor, the first resistor being directly connected to the input terminal, the second resistor being directly connected to output terminal.

5. The amplification device according to claim 4, wherein the second capacitor circuit is composed only of the second capacitor, the first resistor and the second resistor.

6. The amplification device according to claim 1, wherein at least one of the following is true:
the third resistor of the resistor circuit is arranged to couple the input terminal to a reference potential or
the fourth resistor of the resistor circuit is arranged to couple the output terminal to the reference potential.

7. The amplification device according to claim 1, wherein the amplification circuit comprises or is formed by a field effect transistor having a gate terminal, wherein the output terminal is connected to the gate terminal.

8. An amplification device configured for amplifying a signal, the amplification device comprising:
a coupling filter circuit having an input terminal for receiving an input signal and an output terminal for outputting a filtered output signal, wherein the coupling filter circuit is configured to at least attenuate a DC signal component of the input signal to obtain the filtered output signal, wherein the coupling filter circuit comprises
a first capacitor circuit connecting the input terminal to the output terminal, the first capacitor circuit comprising a first capacitor;
a second capacitor circuit connected in parallel to the first capacitor circuit, the second capacitor circuit comprising a second capacitor, a first resistor and a second resistor, the second capacitor, the first resistor and the second resistor being serially connected; and
a resistor circuit connected to the input terminal and the output terminal, the resistor circuit comprising a third resistor connected to the input terminal and a fourth resistor connected to the output terminal;
an amplification circuit connected to the output terminal, the amplification circuit being configured to amplify the filtered output signal to obtain an amplified filtered signal; and
a further coupling filter circuit, wherein the further coupling filter circuit comprises a further input terminal for receiving an inverted version of the input signal and a further output terminal for outputting a further filtered output signal, and wherein the coupling filter circuit comprises integrated capacitors according to a metal-insulator-metal technology.

9. The amplification device according to claim 1, comprising a further amplification circuit, arranged downstream the further coupling filter circuit.

10. The amplification device according to claim 1, further comprising:
a further first capacitor circuit connecting the further input terminal to the further output terminal, the further first capacitor circuit comprising a further first capacitor;
a further second capacitor circuit connected in parallel to the further first capacitor circuit, the further second capacitor circuit comprising a further second capacitor, a further first resistor and a further second resistor, the further second capacitor, the further first resistor and the further second resistor being serially connected; and
a further resistor circuit connected to the further input terminal and the further output terminal, the further resistor circuit comprising a further third resistor connected to the further input terminal and a further fourth resistor connected to the further output terminal, wherein
the third resistor of the resistor circuit and the further third resistor of the further resistor circuit are electrically connected, and the coupling filter circuit is connected to the further coupling filter circuit.

11. The amplification device according to claim 10, wherein the third resistor and the further third resistor are electrically connected at a connection point, wherein the amplification device comprises a shunting capacitor connecting the connection point to a reference potential.

12. The amplification device according to claim 11, further comprising a diode circuit comprising a first diode and a second diode, the first diode and the second diode being connected antiparallel to each other in an antiparallel diode circuit that connects the connection point to a reference potential.

13. The amplification device according to claim 1, wherein the respective input terminal is connected via a shunt resistor to a reference potential.

14. The amplification device according to claim 8, wherein the second capacitor circuit is connected in parallel to the first capacitor of the first capacitor circuit.

15. The amplification device according to claim 1, wherein the coupling filter circuit comprises integrated capacitors according to a metal-insulator-metal technology.

16. An optical receiver, comprising:
an amplification device, wherein the amplification device comprises:
a coupling filter circuit having an input terminal for receiving an input signal and an output terminal for outputting a filtered output signal, wherein the coupling filter circuit is configured to at least attenuate a DC signal component of the input signal to obtain the filtered output signal, wherein the coupling filter circuit comprises
a first capacitor circuit connecting the input terminal to the output terminal, the first capacitor circuit comprising a first capacitor;
a second capacitor circuit connected in parallel to the first capacitor circuit, the second capacitor circuit comprising a second capacitor, a first resistor and a second resistor, the second capacitor, the first resistor and the second resistor being serially connected; and
a resistor circuit connected to the input terminal and the output terminal, the resistor circuit comprising a third resistor connected to the input terminal and a fourth resistor connected to the output terminal;
an amplification circuit connected to the output terminal, the amplification circuit being configured to amplify the filtered output signal to obtain an amplified filtered signal; and
a further coupling filter circuit, wherein the further coupling filter circuit comprises a further input terminal for receiving an inverted version of the input signal and a further output terminal for outputting a further filtered output signal, and wherein the amplification device comprises:
a further first capacitor circuit connecting the further input terminal to the further output terminal, the further first capacitor circuit comprising a further first capacitor;

a further second capacitor circuit connected in parallel to the further first capacitor circuit the further second capacitor circuit comprising a further second capacitor, a further first resistor and a further second resistor, the further second capacitor, the further first resistor and the further second resistor being serially connected; and a further resistor circuit connected to the further input terminal and the further output terminal, the further resistor circuit comprising a further third resistor connected to the further input terminal and a further fourth resistor connected to the further output terminal, wherein the third resistor of the resistor circuit and the further third resistor of the further resistor circuit are electrically connected at a connection point, and the coupling filter circuit is connected to the further coupling filter circuit, and wherein the amplification device comprises a shunting capacitor connecting the connection point to a reference potential; and a converter being configured to convert an optical signal into an electrical signal.

17. The amplification device according to claim 6, wherein the reference potential is a ground potential.

18. The amplification device according to claim 9, wherein the further amplification circuit comprises a further field effect transistor.

19. The amplification device according to claim 13, wherein the reference potential is a ground potential.

20. The amplification device according to claim 1, wherein the respective coupling filter circuit has a lower cut-off frequency being equal to 300 kHz with a tolerance range of +/−5% or +/−10%.

* * * * *

UNITED STATES PATENT AND TRADEMARK OFFICE
CERTIFICATE OF CORRECTION

PATENT NO. : 12,334,879 B2  
APPLICATION NO. : 17/689444  
DATED : June 17, 2025  
INVENTOR(S) : Antonio Musio and Luca Piazzon Page 1 of 1

It is certified that error appears in the above-identified patent and that said Letters Patent is hereby corrected as shown below:

In the Claims

In Column 13, In Line 2, In Claim 16, after "circuit" insert -- , --.

Signed and Sealed this  
Sixteenth Day of September, 2025

Coke Morgan Stewart  
*Acting Director of the United States Patent and Trademark Office*